United States Patent
Nakashima et al.

(10) Patent No.: US 7,262,973 B2
(45) Date of Patent: Aug. 28, 2007

(54) POWER CONVERSION MODULE DEVICE AND POWER UNIT USING THE SAME

(75) Inventors: Koji Nakashima, Mie (JP); Etsuo Tsujimoto, Mie (JP); Yoshiyuki Miyoshi, Mie (JP); Tomio Marui, Mie (JP); Michihiro Miyauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 245 days.

(21) Appl. No.: 10/502,609

(22) PCT Filed: Dec. 5, 2003

(86) PCT No.: PCT/JP03/15607

§ 371 (c)(1),
(2), (4) Date: Jul. 27, 2004

(87) PCT Pub. No.: WO2005/025042

PCT Pub. Date: Mar. 17, 2005

(65) Prior Publication Data

US 2005/0083665 A1     Apr. 21, 2005

(30) Foreign Application Priority Data

Aug. 29, 2003  (JP) ............................. 2003-306624
Sep. 30, 2003  (JP) ............................. 2003-340431

(51) Int. Cl.
- H05K 7/02 (2006.01)
- H05K 7/06 (2006.01)
- H05K 7/08 (2006.01)
- H05K 7/10 (2006.01)

(52) U.S. Cl. ............... 361/760; 361/702; 361/813
(58) Field of Classification Search ........ 361/704–710, 361/760, 775
See application file for complete search history.

(56) References Cited

U.S. PATENT DOCUMENTS

| | | | | |
|---|---|---|---|---|
| 4,873,757 A | * | 10/1989 | Williams | 29/602.1 |
| 5,526,234 A | * | 6/1996 | Vinciarelli et al. | 361/740 |
| 5,926,373 A | * | 7/1999 | Stevens | 361/704 |
| 5,973,923 A | * | 10/1999 | Jitaru | 361/704 |
| 6,060,150 A | | 5/2000 | Nakatani et al. | |
| 6,570,099 B1 | * | 5/2003 | Hirano et al. | 174/258 |

FOREIGN PATENT DOCUMENTS

| | | |
|---|---|---|
| EP | 1 150 311 | 10/2001 |
| JP | 5-198445 | 8/1993 |
| JP | 5-328713 | 12/1993 |
| JP | 6-276737 | 9/1994 |

(Continued)

*Primary Examiner*—Tuan T. Dinh
(74) *Attorney, Agent, or Firm*—Wenderoth, Lind & Ponack, L.L.P.

(57) ABSTRACT

In a power conversion module device of the present invention, a transformer, a primary power element and a secondary power element are mounted on a printed wiring board in surface-to-surface contact therewith, and no control circuit is mounted thereon. In addition to reducing impedance and loss in the wiring, this constitution improves the voltage waveform of the primary power element. Thus, noise reduction can be achieved. Further, because heat can be transferred to the printed wiring board, heat generated from the transformer, the primary power element and the secondary power element can be reduced. The size of the transformer can also be reduced.

26 Claims, 7 Drawing Sheets

FOREIGN PATENT DOCUMENTS

| | | |
|---|---|---|
| JP | 8-045748 | 2/1996 |
| JP | 8-316054 | 11/1996 |
| JP | 8-316060 | 11/1996 |
| JP | 10-050522 | 2/1998 |
| JP | 2001-103756 | 4/2001 |
| JP | 2001-359281 | 12/2001 |

* cited by examiner

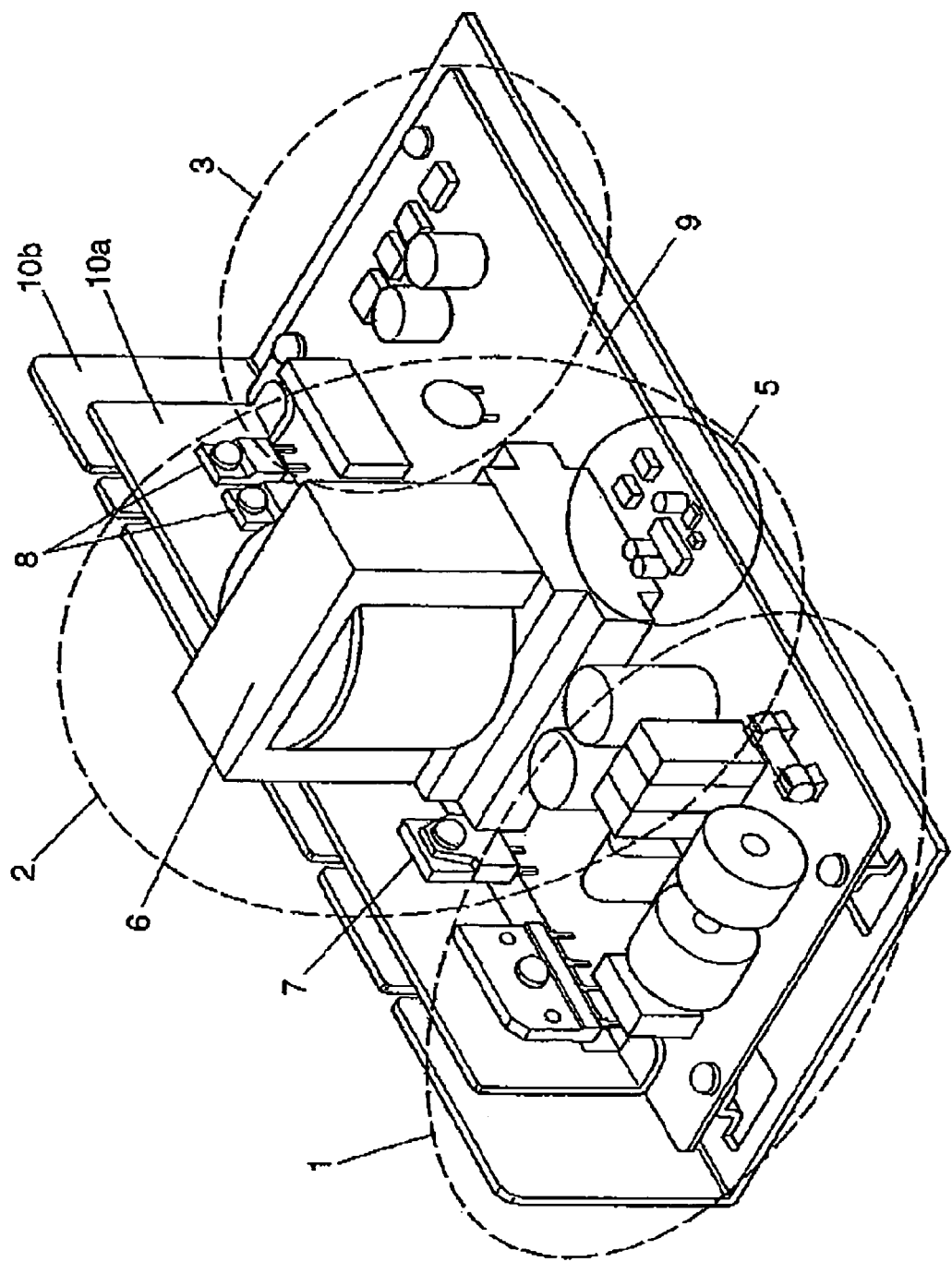

POWER CONVERSION MODULE DEVICE AND POWER UNIT USING THE SAME

TECHNICAL FIELD

The present invention relates to a power unit, such as a switching power supply, for use in electronic equipment, and to a power conversion module device incorporated in the power unit.

BACKGROUND ART

In the recent large increase in the amount of telecommunications, power consumption tends to increase in any electronic equipment, and lower power consumption is becoming a social concern. In particular, many of the power supply parts of such electronic equipment are mainly made of switching power supplies. Enhancing the efficiency, and reducing the size and noise of this power supply part are technical problems to be addressed. Development of this power supply at high speeds is an important breakthrough in the development of electronic equipment.

Conventionally, this kind of switching power supply has been structured as shown in FIGS. 8 and 9.

Hereinafter, a description is provided of a conventional example with reference to FIGS. 8 and 9. FIG. 8 is a circuit block diagram of a conventional switching power supply. FIG. 9 is a perspective view showing an appearance of the conventional switching power supply.

As shown in FIGS. 8 and 9, generally, a conventional switching power supply is structured so that input circuit part 1, converter part 2, and output circuit part 3 are mounted on single main substrate 9.

Input circuit part 1 is made of input filter 1a, input rectifier circuit 1b, power-factor improvement circuit 4, smoothing circuit 1c and other components. Converter part 2 is made of control circuit 5, transformer 6, primary power element 7, secondary power element 8 and other components. Now, in many cases, a field-effect transistor (hereinafter referred to as a FET) is used as primary power element 7, and a diode is used as secondary power element 8. However, as a switch instead of a diode, a FET is used in some cases. Further, output circuit part 3 is made of output smoothing section 3a, output conversion circuit 3b, output filters 3c and other components.

According to some of the technical references of the prior art of this application, a circuit block including a control circuit is modularized, as disclosed in Japanese Patent Unexamined Publication No. 2001-359281 (Reference 1), No. H5-198445 (Reference 2), and No. 2001-103756 (Reference 3), for example.

According to another technical reference of the prior art of this application, a wiring pattern for transferring the heat of a heat sink attached to a printed coil transformer, primary power element, and secondary rectifier circuit is provided on a mounting substrate, as disclosed in Japanese Patent Unexamined Publication No. H8-45748 (Reference 4).

However, in the constitution of FIGS. 8 and 9, which shows the most common conventional example, each circuit block and all the components are mounted on single main substrate 9. For this reason, the specification of each component delicately relates to and interferes with each other, and thus the determination of final specifications is difficult. This poses the following problems in the efficiency of development and design: a highly experienced person familiar with designing and an extremely long development lead time are necessary. Additionally, when the output of the power supply is increased, the size of transformer 6 mounted on converter part 2 must be extremely increased. The size exceeds the limitation on the shape of the power supply, and the temperature of the transformer rises and exceeds a specified value. Thus, the conventional example also has problems in reduction in the size and heat generation.

In each of the inventions of References 1 through 3, a specific portion is modularized to reduce the size. However, because the portion is a complicated module block that has many components and many functions, including a control circuit, determination of the specifications is much more difficult than that of the conventional example of FIGS. 8 and 9. This significantly increases the time and cost for development, and provides an expensive power supply block. For this reason, these inventions have many problems, e.g. limited fields and applications in market deployment.

In the invention of Reference 4, because the terminals of the transformer and the heat sink are connected by wiring patterns, the pattern design is limited. Additionally, long wirings increase the impedance, noise, and loss in the wirings. Further, because heat is transferred via the wiring patterns and the distance to the heat sink is long, improvement of the heat transfer effect is limited to a certain level. Thus, this invention has many problems.

SUMMARY OF THE INVENTION

A power conversion module device is provided in which a transformer and at least one of a primary power element and a secondary power element are mounted on a printed wiring board in surface-to-surface contact therewith, and the components on the printed wiring board are connected to a control circuit part provided on another substrate via an external connection terminal on the 6 printed wiring board.

BRIEF DESCRIPTION OF THE DRAWINGS

FIG. 9 is a perspective view showing an appearance of the conventional switching power supply.

DETAILED DESCRIPTION OF PREFERRED EMBODIMENTS

First Exemplary Embodiment

The first exemplary embodiment is described hereinafter.

Figure 1A:
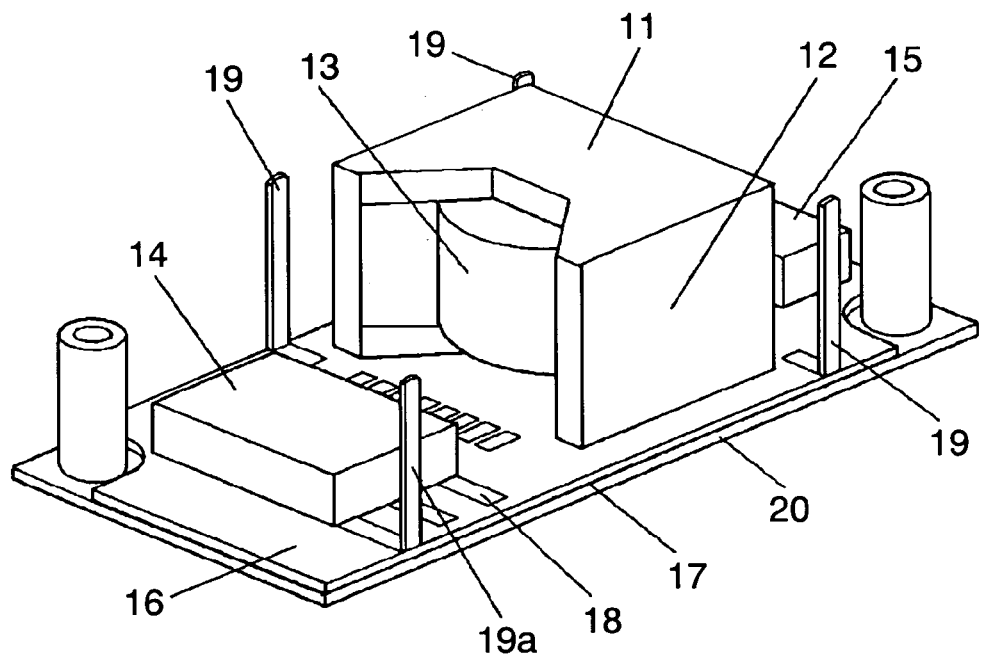
FIG. 1A is a perspective view showing an appearance of a power conversion module device in accordance with a first exemplary embodiment of the present invention.
Figure 1B:
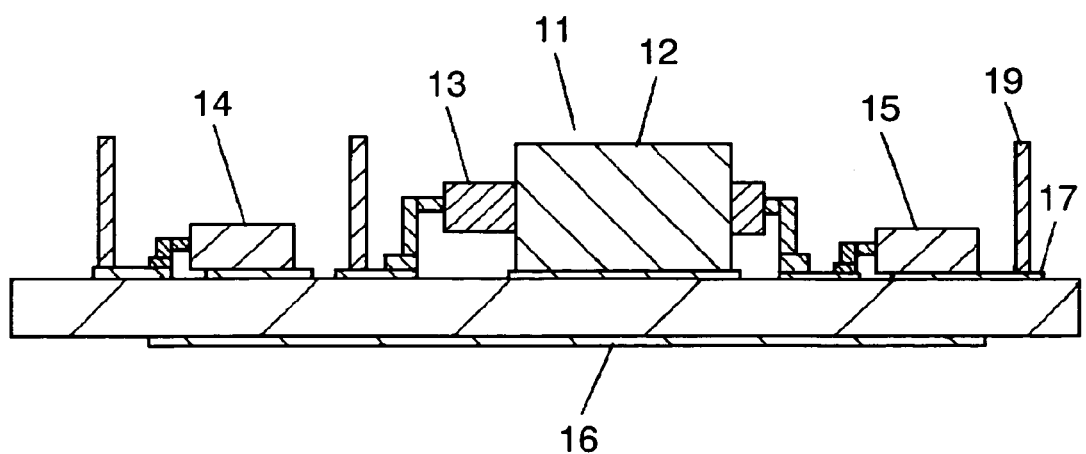
FIG. 1B is a diagram illustrating a constitution of the power conversion module device in accordance with the first exemplary embodiment.
Figure 2:
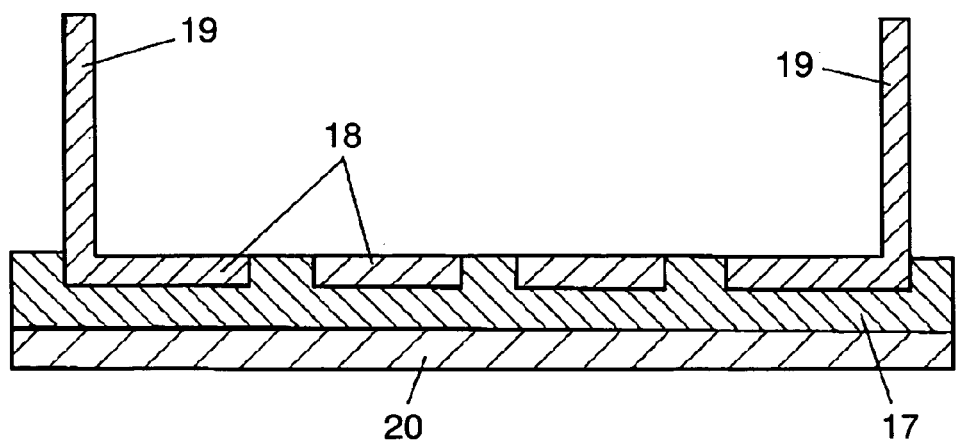
FIG. 2 is a schematic sectional view of a printed wiring board, i.e. a highly heat radiating board, in accordance with the first exemplary embodiment.
Figure 3:
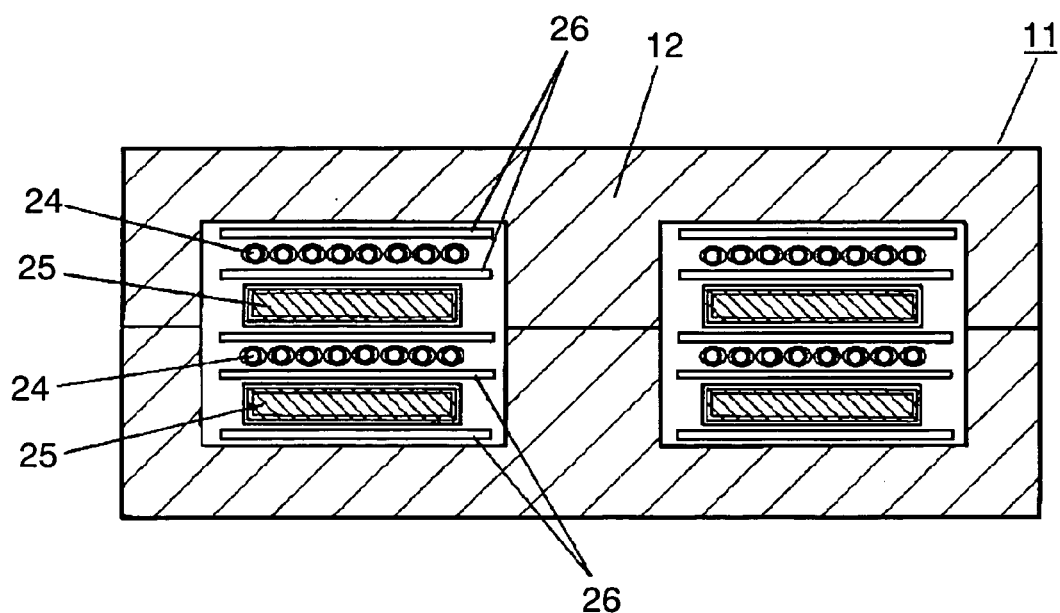
FIG. 3 is a schematic sectional view of a transformer in accordance with the first exemplary embodiment.

FIG. 1A is a perspective view showing an appearance of a power conversion module device in accordance with the first exemplary embodiment of the present invention. FIG. 1B is a diagram illustrating a constitution thereof. FIG. 2 is a schematic sectional view of a printed wiring board, i.e. a highly heat radiating board, in accordance with the first exemplary embodiment. FIG. 3 is a schematic sectional view of a transformer in accordance with the first exemplary embodiment.

With reference to FIGS. 1A and 1B, a power conversion module device is made of transformer 11, magnetic core 12, thin laminated coil 13, primary power element 14, secondary power element 15, printed wiring board 16, insulator 17, wiring board unitary with lead frame 18, lead frames 19, lead frame 19a for connection to control circuit, and metal plate 20. With reference to FIG. 3, transformer 11 is made of three-layered insulated wire coils 24, copper plate coils 25, and insulators 26.

In FIGS. 1A and 1B, what is significantly different from FIG. 9 showing the conventional example is that only heat-generating components, i.e. transformer 6, primary power element 7, secondary power element 8, other than control circuit 5 in converter part 2 of FIG. 9 are grouped into a block. This invention also has the following different points. Transformer 6 of FIG. 9 is changed to transformer 11. This transformer 11, primary power element 14, and secondary power element 15 are mounted on printed wiring board 16. These transformer 11, primary power element 14, and secondary power element 15 are mounted on printed wiring board 16 in surface-to-surface contact therewith.

In the constitution of FIGS. 1A and 1B, transformer 11, primary power element 14, and secondary power element 15 can be disposed adjacent to each other with the shortest distance provided therebetween, and thus the wiring distance can be minimized. This reduces the wiring impedance, and can extremely reduce the loss in wirings. Additionally, the ringing waveform (Vp–p) of the voltage (Vds) across the drain and source of a field-effect transistor (FET), i.e. the primary power element, which is a source of noise, can be drastically improved. The waveform of the voltage across both ends of a diode, i.e. the secondary power element, can also be drastically improved. Thus, the noise reduction of the power supply can be achieved.

Because transformer 11, primary power element 14, and secondary power element 15 are mounted on this printed wiring board 16 in surface-to-surface contact therewith, the heat from major heat-generating components of the power supply, i.e. transformer 11, primary power element 14, and secondary power element 15, can be directly transferred to printed wiring board 16 via the contact surface. Therefore, the heat generated from transformer 11, primary power element 14, and secondary power element 15 can be drastically reduced, and the size of transformer 11 can be reduced. Further, unlike the conventional example, the block of the present invention does not incorporate a complicated control circuit including many components. This constitution simplifies the design of this block, and even a person unfamiliar with power supply design can design the block for a short period of time. As a result, a small power conversion module device that has less heat generation, loss, and noise as well as a drastically improved development efficiency can be provided.

In this embodiment, a FET is mainly used for primary power element 14, and a FET or diode is mainly used for secondary power element 15. However, other elements can be used. The effects of the present invention can be obtained even when at least one of primary power element 14 and secondary power element 15 is mounted.

FIG. 2 is a schematic sectional view of highly heat radiating board 16 used for printed wiring board 16 constituting the first exemplary embodiment. As shown in FIG. 2, highly heat radiating board 16 is made by bonding wiring board unitary with lead frame 18 and insulator 17, and further bonding metal plate 20 to the backside of insulator 17. Insulator 17 employed in this embodiment has an average thickness of 0.5 mm, and a minimum thickness of 0.4 mm is ensured in production. This value is the minimum thickness approved as reinforced insulation according to safety standards. By ensuring this thickness, the insulator can comply with the safety standards.

As described above, according to FIG. 2, since highly heat radiating board 16 is especially structured so that insulator 17 and wiring board unitary with lead frame 18 are bonded to each other, the wiring board can be positioned with respect to lead frames 19. Additionally, by making insulator 17 thicker than the specified thickness, highly heat radiating board 16 can comply with the safety standards.

By making the insulator have a thickness of at least 0.4 mm, reinforced insulation required by the safety standards can be provided. Thus, the power supply has a wider range of applications.

Now, for insulator 17, one of the constituent components of highly heat radiating board 16, an insulating resin having excellent adherence with wiring board unitary with lead frame 18, such as epoxy, is used. This significantly enhances the adherence between insulator 17 and wiring board unitary with lead frame 18, thus improving the heat transfer properties of highly heat radiating board 16.

Further, when the epoxy resin of this insulator 17 is filled with mineral filler, e.g. silica and alumina, the thermal conductivity of the resin can be improved, and thus, the thermal conduction properties of highly heat radiating board 16 can further be improved. According to experimental results, it has been confirmed that the thermal conductivity can be improved from 0.15–0.3 W/(m·K) (with no filler) to 3–5 W/(m·K) (with filler), by one digit.

When insulator 17, one of the constituent components of highly heat radiating board 16, is made of a ceramic material, the thermal conductivity thereof is further improved. Additionally, an effect of introducing a highly heat radiating board made by a novel technique, i.e. application of a ceramic sheet substrate, can be obtained.

Incidentally, wiring board unitary with lead frame 18 has a thickness of at least 0.3 mm. Copper foil employed for a general printed wiring board is not so thick, because it is mass produced by etching in consideration of general-purpose applications and cost. Such copper foil is extremely thin. The thickness ranges from approximately 0.2 to 0.25 mm at maximum, and ranges from approximately 0.018 to 0.07 mm in general. For this reason, the cross-sectional area of the conductor cannot be made large. A small cross-sectional area poses a problem of increasing the impedance and lost in the wirings. As mentioned above, the present invention employs a thin copper plate having a thickness of at least 0.3 mm, which is considered difficult in production, and increases the cross-sectional area of the conductor.

Because this can supremely minimize the wiring impedance, effects of minimizing the wiring loss and providing a wiring board standing for a large current can be obtained.

To produce the lead frame used in this embodiment, various methods, e.g. punching using a die, and etching, can be considered. However, the methods need not be limited to these methods.

When lead frame 19 is bent to provide a lead for output, as shown in FIG. 2, lead frame 19 also serves as a lead for output, and thus a pin for output connection and connection step are unnecessary. Because the number of junction points is reduced, the reliability improves. Thus, many effects can be obtained.

Now, at least one of the leads for output connection is used as lead 19a for connection to a control circuit. Because this constitution enables connection to a control circuit formed on a separate substrate, this module device can easily be controlled from the separate substrate.

Additionally, because metal plate 20 is bonded on the backside of insulator 17 as shown in FIG. 1, the heat on the printed wiring board can also be transferred to this metal plate 20. This heat transfer can reduce the temperature rise of transformer 11, primary power element 14, and secondary power element 15.

The materials of metal plate 20 used herein need not be limited specifically. However, metals having high heat conductivity, e.g. aluminum and copper, are preferable. Especially when aluminum or the like is used, weight reduction can be achieved.

Additionally, when copper is used, the thermal conduction properties can further be improved, and thus, the temperature rise of transformer 11, primary power element 14, and secondary power element 15 can drastically be reduced.

FIG. 3 is a schematic sectional view of transformer 11 constituting the first exemplary embodiment. As shown in FIG. 3, transformer 11 is made by alternately laminating copper plate coils 25 and three-layered flat insulated wire coils 24 via thin insulators 26 to form a thin laminated coil, and vertically sandwiching the thin laminated coils between halves of the magnetic core 12 to complete thin transformer 11. Each of the copper plate coils 25 is made of a thin copper plate, and each of the three-layered insulated wire coils is made by winding a three-layered insulated wire spirally.

As described above, in FIG. 3 showing the first exemplary embodiment, at least one of a primary coil and a secondary coil in transformer 11 is formed of a coil shaped like a thin plate. This reduces the distance between the primary coil and the secondary coil, thus improving the connection between winding wires and conversion efficiency. Additionally, because thin-plate coil 25 has a large cross-sectional area, it has high heat radiation properties and can provide an effect of reducing the temperature rise of the transformer 11.

Thin-plate coil 26 has a thickness of at least 0.3 mm. The methods of forming thin-plate coil 25 include a method of using a printed wiring board, other than those described above. However, copper foil employed for a general printed wiring board is not so thick, because it is mass-produced by etching in consideration of general-purpose applications and cost. Such copper foil is extremely thin. The thickness ranges from approximately 0.2 to 0.25 mm at maximum, and ranges from approximately 0.018 to 0.07 mm in general. For this reason, the cross-sectional area of the conductor cannot be made large. A small cross-sectional area poses a problem of increasing the impedance and lose in the wirings. As mentioned above, the present invention employs a thin copper plate having a thickness of at least 0.3 mm, which is considered difficult in production, and increases the cross-sectional area of the conductor. This can reduce the resistance of the coil, and provides effects of reducing a loss in the transformer and providing a coil standing for a large current.

To produce a copper plate coil used in this embodiment, various methods, e.g. punching using a die, and etching, can be considered. However, the methods need not be limited to these methods.

According to FIG. 3 showing the first exemplary embodiment, at least one of the primary coil and secondary coil in transformer 11 is formed by winding a three-layered insulated wire spirally. The three-layered insulated wire used herein is a TIW wire, which is a wire material approved as reinforced insulation according to the safety standards of individual countries. Thus, reinforced insulation complying with the safety standards can be provided as transformer 11. This can provide an effect of easily realizing a transformer complying with the safety standards at high voltage input. The three-layered insulated wire need not be made of the aforementioned wire material necessarily. Any wire material approved as reinforced insulation according to the safety standards, such as a TEX wire, can be used.

At least one of the primary coil and the secondary coil in transformer 11 is formed by winding a winding wire. Because the number of wire turns can be changed, an effect of more freely designing can be provided.

Further, the aforementioned coil made of a winding wire has a fusion layer on the surface thereof. Because this fusion layer allows a wound winding wire to be bonded together, an effect of easily forming a winding without a bobbin can be obtained.

In this embodiment, the fusion layer is a type fused by alcohol. Because a winding wire is easily bonded together by the application of alcohol, an effect of easy installation can be obtained.

In the first exemplary embodiment, thin laminated coil 13 constituting transformer 11 uses three-layered insulated wire coils 24, thin-plate copper plate coils 25, and the like as shown in FIG. 3. However, when at least one of the primary coil and the secondary coil is made of a printed board, the position of the coil conductor is stabilized, and thus, variations in performance can be reduced.

Further, when epoxy prepregs are inserted between the layers of the coil made of this printed board to form a multi-layered printed board coil, the thickness and outside dimension of the laminated coil are stabilized. Thus, variations in performance can be further reduced and a later step of combining with magnetic core halves 12 can be performed easily.

In FIGS. 1A and 1B showing the first exemplary embodiment, transformer 11 is mounted on printed wiring board 16 so that the bottom surface of magnetic core 12 of the transformer is in contact with the printed wiring board 16. With this constitution, heat generated from magnetic core 12 can also be transferred to the surface of the board, and an effect of drastically reducing the temperature rise of transformer 11 can be provided.

Further, although not shown herein, patterns are formed on the surface of printed wiring board 16 facing toward magnetic core 12. Thus, the heat from the magnetic core also can be transferred to these patterns, and an effect of further drastically reducing the heat generated from transformer 11 can be provided.

Further, although not shown, in the first exemplary embodiment, a thermal conductive member is especially inserted between magnetic core 12 and printed wiring board 16. The thermal conductive member fills gaps generated between magnetic core 12 and printed wiring board 16, and thus, an effect of reducing variations in thermal conduction can be provided. As the thermal conductive member, materials having high thermal conductivity are preferable. However, any material which is capable of filling the gaps can be used without limitation. Epoxy, silicon, acrylic resins, and the like can be used.

In the first exemplary embodiment, as shown in FIGS. 1A and 1B, transformer 11 is disposed especially between primary power element 14 and secondary power element 15. For this reason, the wiring patterns between transformer 11 and primary power element 14 and secondary power element 15 electrically insulated with each other can be formed at the shortest distance. Thus, an effect of easily realizing a pattern design that can drastically reduce the wiring loss can be provided.

As shown in FIGS. 1A and 1B, transformer 11, primary power element 14, and secondary power element 15 are mounted on a single principal plane of printed wiring board 16. Thus, even heavy components can be easily mounted by reflow soldering or other methods.

As shown in FIGS. 1A and 1B, transformer 11, primary power element 14, and secondary power element 15 can be mounted On the single principal plane of printed wiring board 16. For this reason, a power conversion module can be produced by using a single-sided board, which is inexpensive as a printed wiring board.

On the other hand, a double-sided board can also be used as printed wiring board 16. To decrease the temperature of heat-generating components, materials having high thermal conductivities as large as possible should be disposed in a position as nearest as possible to the heat-generating components. Resin used in printed wiring board 16 has low thermal conductivity and, thermal conduction is made mainly by copper foil. For this reason, it is necessary to increase the area of the wiring patterns on printed wiring board 16 having transformer 11, primary power element 14, secondary power element 15 mounted thereon. However, in some cases, sufficiently large patterns cannot be obtained because of the downsizing of equipment. To address this problem, copper foil patterns for heat radiation ate provided on the backside of the surface having transformer 11, primary power element 14, and secondary power element 15 mounted thereon, by using a double-sided board. Thus, downsizing of the equipment and inhibition of the temperature rise of the components can be achieved at the same time.

To further inhibit the temperature rise of the components, the insulating resin layer of printed wiring board 16 should be thinner. However, to hold transformer 11, first power element 14, and second power element 15, it is difficult to make the printed wiring board too thin. The thickness of the insulating resin layer should be at least 0.6 mm. To address this problem, a multi-layered board is used instead of a double-sided board, and each insulating layer can be made as thin as approximately 0.1 mm by leaving copper patterns for heat radiation on inner layers. Thus, the temperature rise of the components can be further inhibited.

Further, on the backside of the surface of printed wiring board 16 having transformer 11, first power element 14, and second power element 15 mounted thereon, patterns electrically insulated from the surface having transformer 11, first power element 14, and second power element 15 mounted thereon are provided. The insulated patterns can be attached to a heat sink or the housing of equipment to enhance heat radiation properties. Thus, the temperature rise of transformer 11, first power element 14, and second power element 15 can be reduced.

A similar power conversion module device can be implemented by using a metal base substrate as printed wiring board 16.

Second Exemplary Embodiment

The second exemplary embodiment is described hereinafter.

Figure 4:
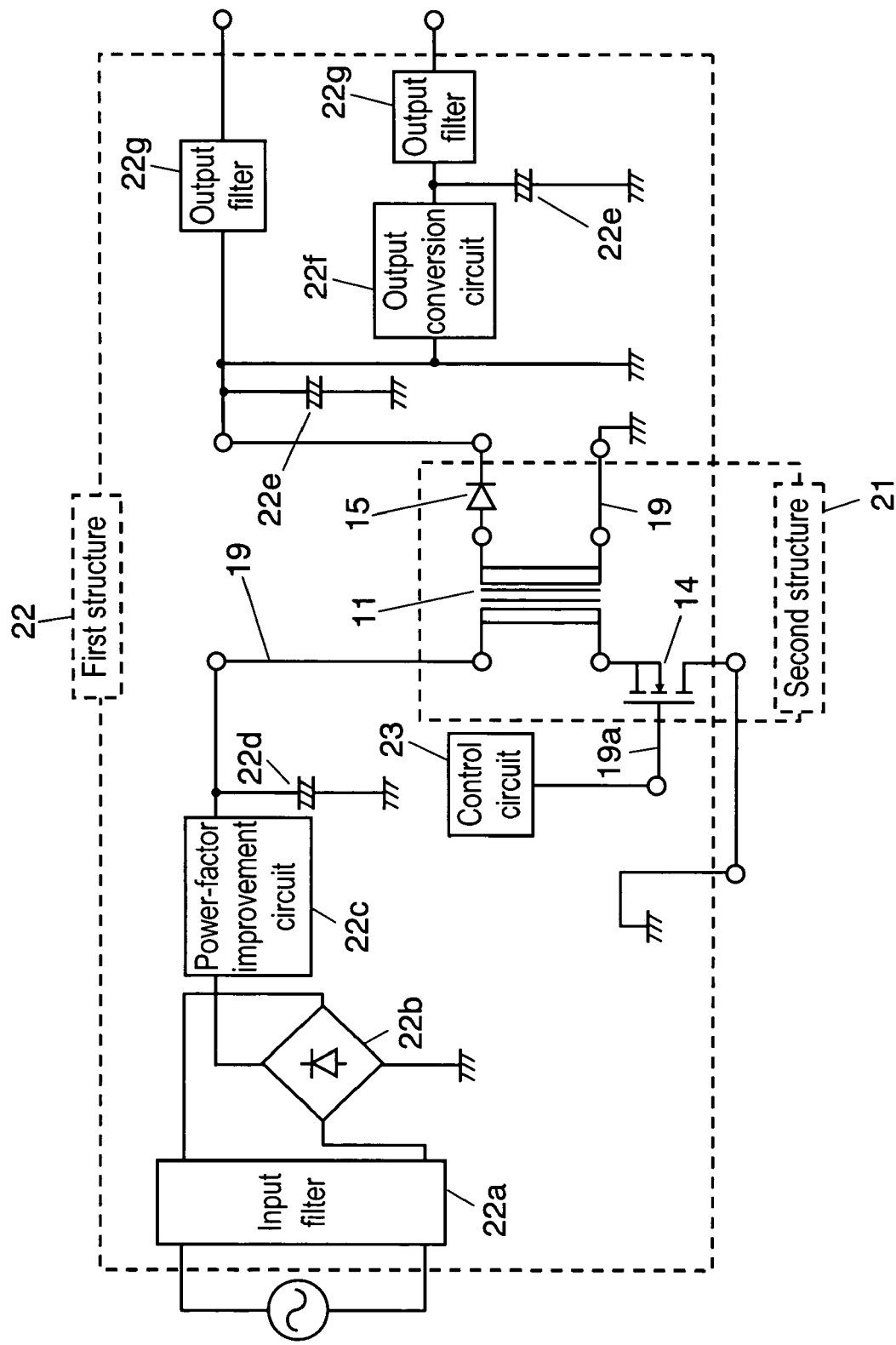
FIG. 4 is a block diagram of a power supply circuit in accordance with a second exemplary embodiment of the present invention.
Figure 5:
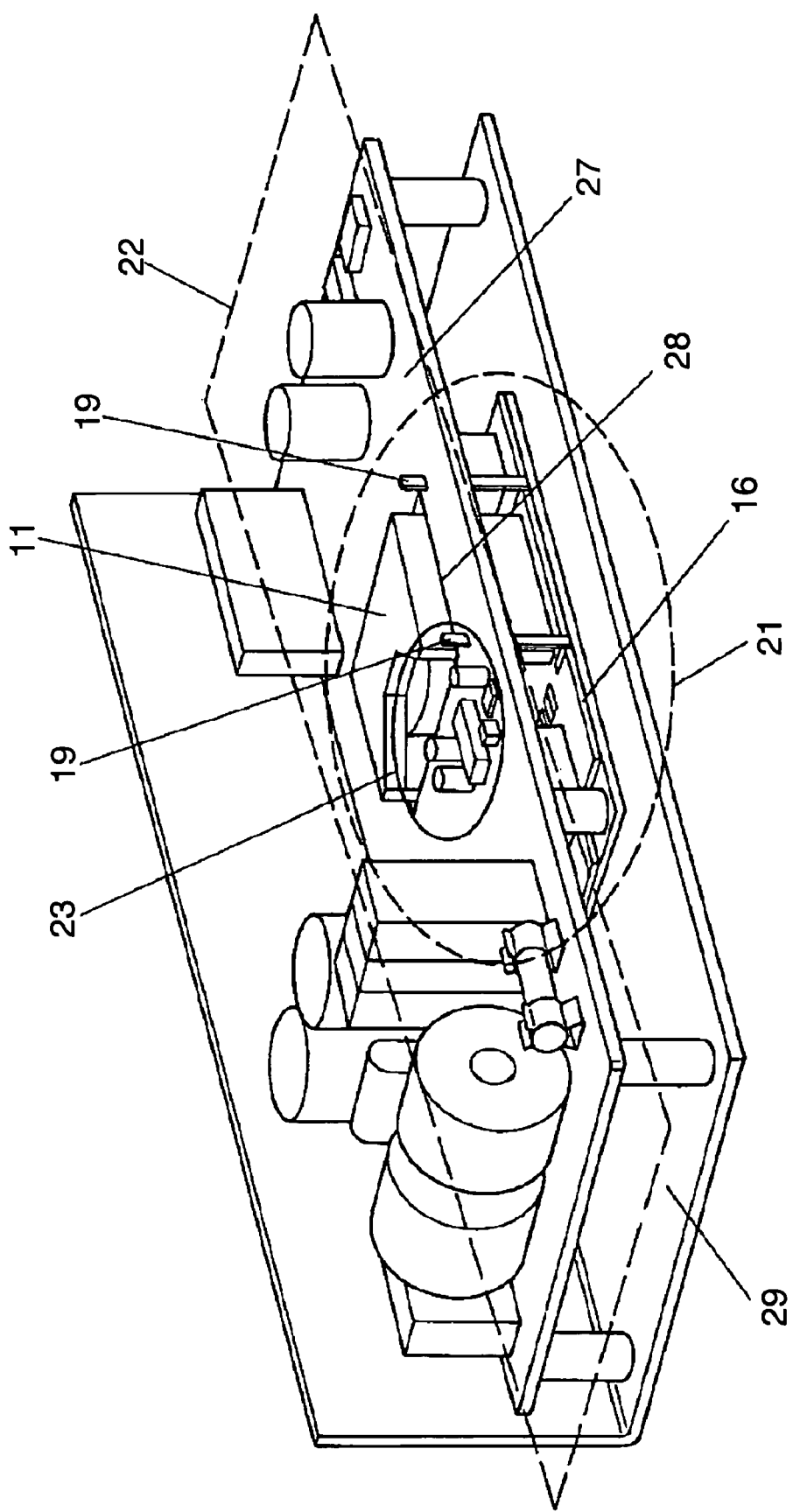
FIG. 5 is a perspective view showing an appearance of a power supply in accordance with the second exemplary embodiment.
Figure 6:
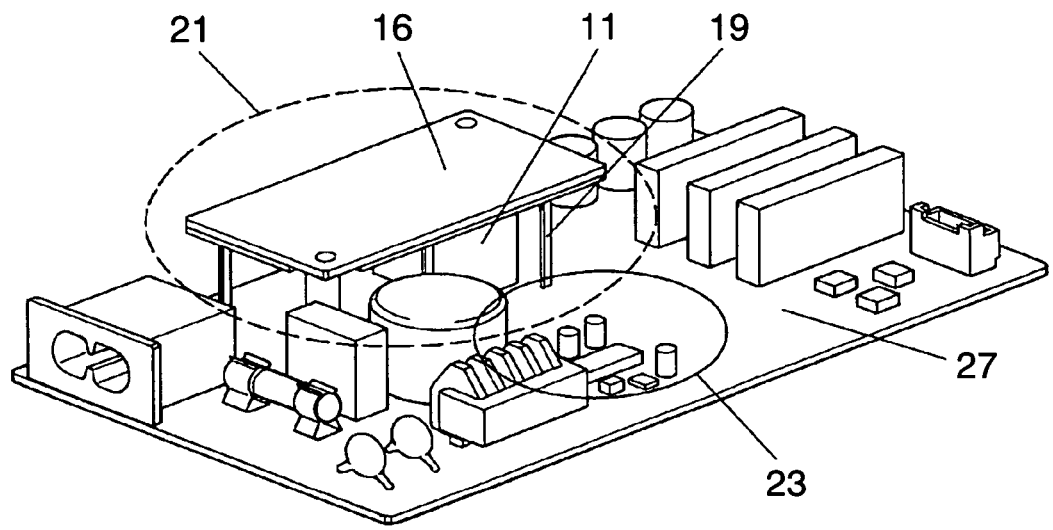
FIG. 6 is a perspective view showing an appearance of a power supply in accordance with another example of the second exemplary embodiment.

FIG. 4 is a block diagram of a power supply circuit in accordance with the second exemplary embodiment. FIG. 5 is a perspective view showing an appearance of a power supply in accordance with the second exemplary embodiment. FIG. 6 is a perspective view showing an appearance of a power supply in accordance with another example of the second exemplary embodiment.

With reference to FIGS. 4 through 6, the power supply is made of second structure 21, first structure 22, control circuit 23, first substrate 27, bore 28, and housing 29. Elements similar to those of the first exemplary embodiment are denoted with the same reference marks and descriptions thereof are omitted.

Figure 8:
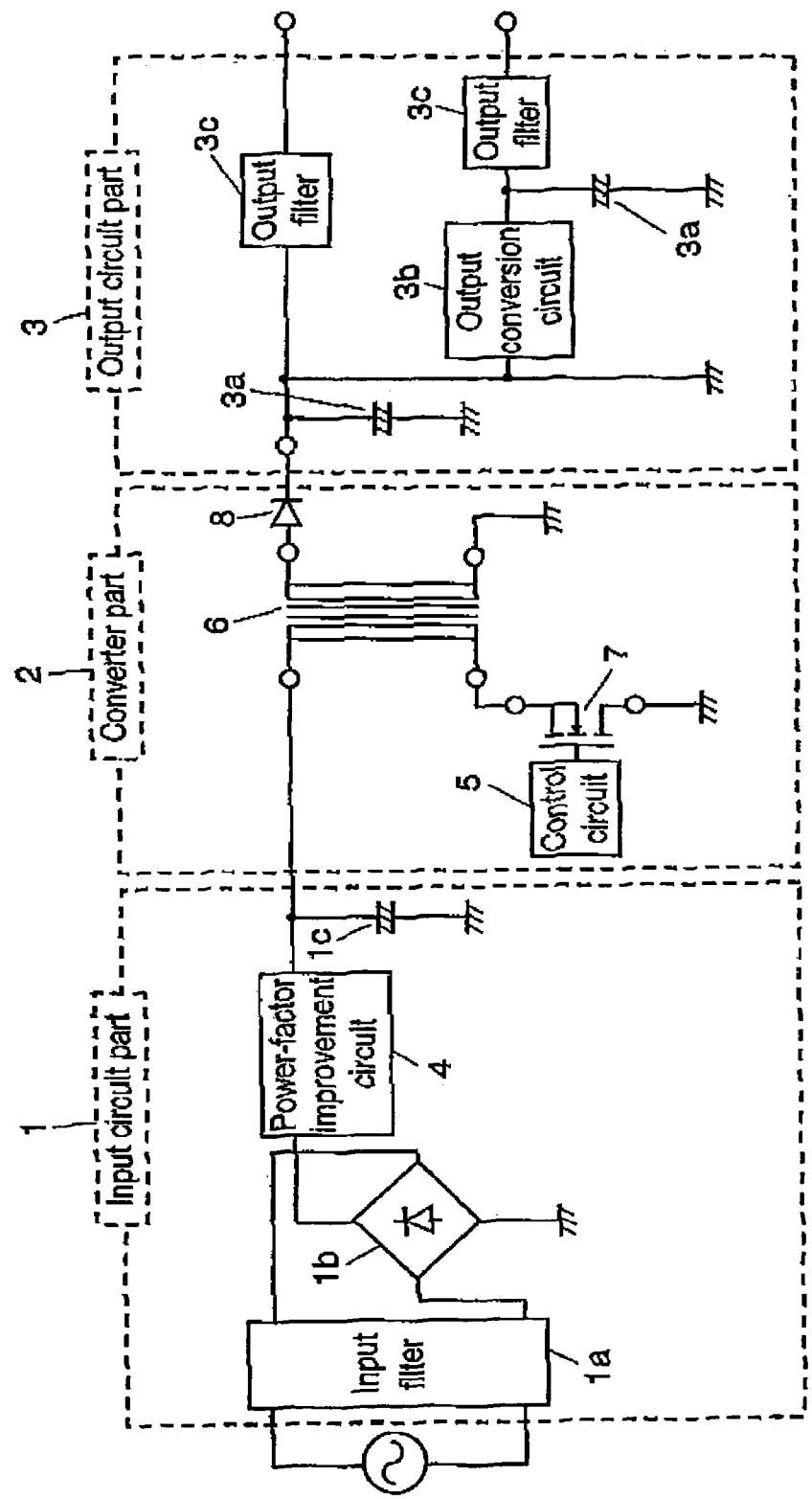
FIG. 8 is a circuit block diagram of a conventional switching power supply.

In FIGS. 4 through 6, what is significantly different from FIGS. 8 and 9 showing the conventional example is that a power conversion module device proposed in the first embodiment is used in converter part 2, as second structure 21.

As shown in FIG. 4, second structure 21 is formed of transformer 11, primary power element 14, and secondary power element 16, as a separate block. Components except this second structure 21, such as input filter 22a, input rectifier circuit 22b, power-factor improvement circuit 22c, smoothing circuit 22d, control circuit 23, output smoothing section 22e, output conversion circuit 22f, and output filters 22g, are formed on a separate substrate, as first structure 22. The circuits of these first structure 22 and second structure 21 are connected and integrated to complete a power supply.

FIG. 5 is a perspective view showing an appearance of the power supply in accordance with the second exemplary embodiment. As shown in FIG. 5, bore 28 is provided through first substrate 27 forming first structure 22 and facing toward transformer 11 forming second structure 21. The circuits of first structure 22 and second structure 21 are connected by using lead frames 19 or the like. Further, printed wiring board 16 forming second structure 21 is mounted on housing 29 of the power supply in surface-to-surface contact therewith.

As mentioned above, the second exemplary embodiment of FIGS. 4 and 5 is a power unit having first structure 22 and second structure 21 integrated with each other. Since a power conversion module device proposed in the first embodiment is used as second structure 21, advantages of the device, i.e. a small size, and low heat generation, loss, and noise, can be achieved. This can provide great effects of facilitating thermal and structural design, and drastically reducing the development lead time.

Results of experiments for comparing the characteristics resulting from these differences in basic constitution are shown in Table 1.

TABLE 1

| Evaluated items | | Conventional example (FIG. 9) | Embodiment of present invention (FIG. 5) | Effect |
|---|---|---|---|---|
| Transformer | Volume (index) | 67 × 50 × 43 = 144050 mm³ (Conventional example: 100%) | 47 × 39 × 17 = 31161 mm³ (Ratio to conventional example: 21.6% | 1/4 or smaller |
| | Temperature rise | Approx. 36 K | Approx. 15 k | 1/2 or smaller |
| Power efficiency | (%) | 79.9 | 82.0 | +2.1 |
| Ringing voltage (Vp − p) | Vp · p(V) | 450 | 300 | Less 150 V |
| Disturbance voltage | 100 K–1 MHz | 66 dB | 60 dB | −6 dB |
| | 1 M–5 MHz | 56 dB | 50 dB | −6 dB |
| Remarks (Operating conditions of power supply) | | Circuit: flyback system SW frequency: 100 kHz Output: 12 V 9 A | | |

According to Table 1, the characteristics of the conventional example structured as shown in FIG. 9 and the second exemplary embodiment of the present invention structured as shown in FIG. 6 are compared with each other. The following results are obtained.

(1) The transformer of the present invention is one fourth or less the size of the transformer of the conventional example. Drastic downsizing can therefore be achieved.

(2) The temperature rise of the transformer of the present invention is one half or less the amount of the transformer of the conventional example. Drastic reduction in temperature rise can therefore be achieved.

(3) Power efficiency can drastically be improved by approximately 2.1%.

(4) The ringing voltage (Vp–p) of the voltage across the drain and source (Vds) of the FET can be reduced by 150V, and the waveform can drastically be improved.

(5) The disturbance voltage can be reduced by at least 6 dB in each band. Drastic noise reduction can therefore be achieved.

The aforementioned great effects can be validated by the experimental results.

Incidentally, control circuit 23 for controlling second structure 21 is provided on first substrate 27 forming first structure 22, and the control circuit 23 and the second structure 21 are connected by lead frame 19a for connection to control circuit. Because of this constitution, control circuit 23 can be designed without undergoing influences, including noise generated from second structure 21. This can provide an effect of shortening the lead time for the development and design of control circuit 23.

Further, bore 28 is provided through first substrate 27 forming first structure 22 and facing toward transformer 11 forming second structure 21. Because of this constitution, the height of transformer 11 does not have an influence on the overall height of the power unit. Thus, an effect of providing a thin power unit can be obtained when other components are of low profile.

Lead frames 19 forming second structure 21 connect first structure 22 and second structure 21. Because the structures are directly connected without using pins for connection, the number of junction points is reduced. Thus, effects of improving the reliability and stabilizing the connection strength are provided.

Printed wiring board 16 forming second structure 21 is mounted on housing 29 of the power supply in surface-to-surface contact therewith. Because of this constitution, heat generated from second structure 21 can be radiated on housing 29 of the power supply. Thus, an effect of eliminating the need of a dedicated heat sink for heat radiation 10a shown in the conventional example of FIG. 9 can be provided.

As shown in another example of the second exemplary embodiment of FIG. 6, second structure 21 can also be mounted on first substrate 27 forming first structure 22 so that the top surface of transformer 11 forming second structure 21 is in surface-to-surface contact with the surface of first substrate 27, in a reverse direction. In this installation, printed wiring board 16 forming second structure 21 can be used as a heat sink for heat radiation. Thus, effects of reducing the heat generated from transformer 11, primary power element 14 and secondary power element 15, and eliminating or reducing the need of heat sink for heat radiation 10a can be obtained.

Similar effects can be provided when a highly heat radiating board of the first exemplary embodiment is used as printed wiring board 16.

Third Exemplary Embodiment

The third exemplary embodiment is described hereinafter.

Figure 7:
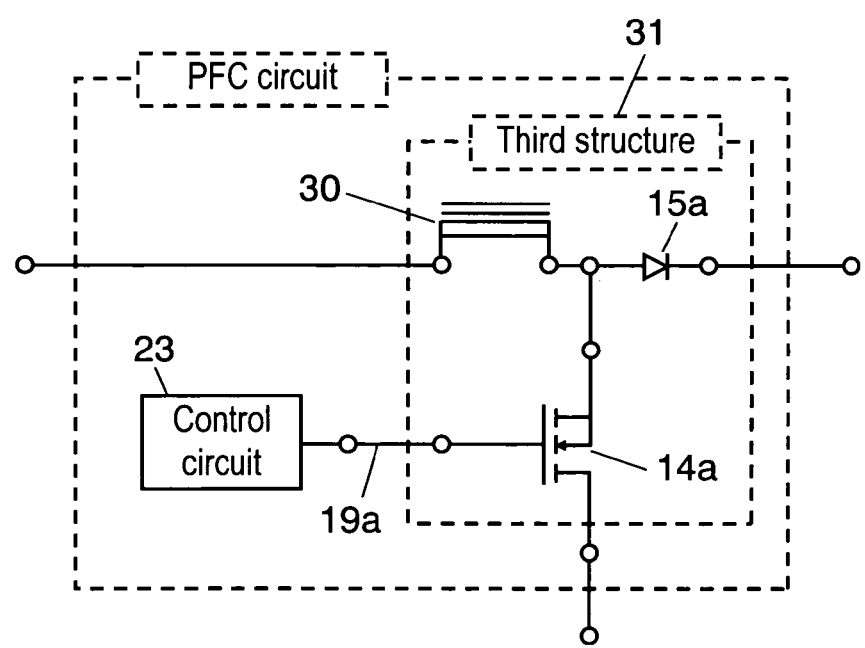
FIG. 7 is a circuit block diagram of a power conversion module device for power-factor improvement in, accordance with a third exemplary embodiment of the present invention.

FIG. 7 is a circuit block diagram of a power conversion module device for a power-factor improvement circuit in accordance with the third exemplary embodiment.

With reference to FIG. 7, the power conversion module device for a power-factor improvement circuit is made of tertiary power element 14a, quaternary power element 15a, choke coil 30, and third structure 31. Elements similar to those of the first and second exemplary embodiments are denoted with the same reference marks and descriptions thereof are omitted.

In FIG. 7, what is significantly different from the first exemplary embodiment is that choke coil 30 substitutes for transformer 11 constituting the power conversion module to form third structure 31. The constitution in which a FET or diode is used as a power element and mounted on a printed wiring board is the same as that of the first embodiment.

As shown in FIG. 7, in the circuit block diagram, third structure 31 is formed of choke coil 30, tertiary power element 14a, and quaternary power element 15a, as a separate block. The third structure does not include a control circuit. Although the power conversion module device of this embodiment is not shown herein, tertiary power element 14a, quaternary power element 15a, and choke coil 30 are mounted on a printed wiring board in surface-to-surface contact therewith. This is completely the same constitution as the first exemplary embodiment of FIGS. 1A and 1B.

In accordance with FIG. 7 showing the third exemplary embodiment, the wiring distance between choke coil 30 and tertiary power element 14a and quaternary power element 15a can be made the shortest. This reduces the wiring impedance and thus can extremely reduce the wiring loss. Additionally, the waveform of the voltage across both ends of the FET or diode is improved and thus noise reduction can be achieved.

Because the heat generated from choke coil 30, tertiary power element 14a, and quaternary power element 16a are transferred to printed wiring board 16 through the contact surface, the size of the choke coil can be reduced, and heat generated from choke coil 30, tertiary power element 14a, and quaternary power element 15a can be drastically reduced. Further, a complicated control circuit including many components is not incorporated. This constitution simplifies the design of this block, and therefore, even a person unfamiliar with power supply design can design the block for a short period of time. As a result, a great effect of providing a small power conversion module device that has less heat generation, loss and noise, and a drastically improved development efficiency can be obtained.

The third exemplary embodiment is a power unit having first structure 22 and third structure 31 integrated with each other. Because a power conversion module device is used as third structure 31, advantages of the power conversion module device, i.e. a small size, and low heat generation, loss, and noise, can be taken. This can provide great effects of facilitating thermal and structural design, and drastically reducing the development lead time.

Further, control circuit 23 for controlling third structure 31 is provided on first substrate 27 forming first structure 22, and the control circuit 23 and the third structure 31 are connected by lead frame 19a for connection to control circuit. Because of this constitution, control circuit 23 can be designed without undergoing influences, including noise generated from third structure 31. This can provide an effect of shortening the lead time for development and design of control circuit 23.

In a power conversion module device of the present invention, a transformer and at least one of a primary power element and a secondary power element are mounted on a printed wiring board in surface-to-surface contact therewith, and the components mounted on the printed wiring board are connected to a control circuit part provided on a separate substrate via an external connection terminal provided on the printed wiring board. This constitution can extremely reduce the wiring loss, and drastically improve the waveform of the FET or diode voltage, which is a source of noise. Thus, noise reduction of the power supply can be achieved. Additionally, the heat generated from the transformer and power elements can drastically be reduced, and the size of the transformer can be reduced. Further, a complicated control circuit including many components is not incorporated. This constitution simplifies the design of this block, and therefore, even a person unfamiliar with power supply design can design the block for a short period of time. As a result, a great effect of providing a small power conversion module device that has less heat generation, loss and noise, and a drastically improved development efficiency can be obtained.

A power unit of the present invention is a power unit having a first structure and a second structure integrated with each other. Because a power conversion module device of the present invention is used as the second structure, and a control circuit part for controlling the second structure is provided on a first substrate forming the first structure, advantages of the power conversion module device, i.e. a small size, and low heat generation, loss, and noise, can be achieved. This can provide great effects of facilitating thermal and structural design, and drastically reducing the development lead time.

INDUSTRIAL APPLICABILITY

A power conversion module device and a power unit using the power conversion module device of the present invention have an effect of greatly improving the efficiency of designing and developing a power supply, in addition to an effect of a small size, and less heat generation, loss, and noise. The present invention can be used for any electronic equipment incorporating a switching power supply.

The invention claimed is:

1. A power conversion module device comprising:
   a printed wiring board;
   a transformer mounted on said printed wiring board in surface-to-surface contact therewith;
   at least one of a primary power element and a secondary power element mounted on said printed wiring board in surface-to-surface contact therewith; and
   an external connection terminal provided on said printed wiring board, said external connection terminal being operable to connect components mounted on said printed wiring board to a control circuit part provided on a separate substrate from said printed wiring board, wherein:
   said printed wiring board has a structure of a highly heat radiating board having an insulator and a wiring board unitary with a lead frame bonded to each other; and
   a metal plate is bonded to a backside of a surface of said insulator having the lead frame.

2. The power conversion module device of claim 1, wherein a thickness of said insulator is at least 0.4 mm.

3. The power conversion module device of claim 1, wherein said insulator is made of an epoxy resin.

4. The power conversion module device of claim 1, wherein said insulator is made of a ceramic material.

5. The power conversion module device of claim 1, wherein the lead frame is formed of a copper plate having a thickness of at least 0.3 mm.

6. The power conversion module device of claim 1, wherein the lead frame is bent to form said external connection terminal of said module.

7. The power conversion module device of claim 1, wherein a material of the metal plate is aluminum.

8. The power conversion module device of claim 1, wherein a material of the metal plate is copper.

9. The power conversion module device of claim 1, wherein said transformer and at least one of said primary power element and said secondary power element are mounted on a single principal surface of said printed wiring board.

10. The power conversion module device of claim 1, wherein said printed wiring board is composed a single-sided printed wiring board having a pattern formed on one side thereof.

11. The power conversion module device of claim 1, wherein said printed wiring board is composed of a double-sided printed wiring board having patterns formed on both sides thereof.

12. The power conversion module device of claim 1, wherein said printed wiring board is composed of a multi-layered printed wiring board.

13. The power conversion module device of claim 1, wherein at least one of a primary coil and a secondary coil of said transformer is formed of a coil shaped like a thin plate.

14. The power conversion module device of claim 1, wherein at least one of a primary coil and a secondary coil of said transformer is formed of a three-layered insulated wire.

15. The power conversion module device of claim 1, wherein at least one of a primary coil and a secondary coil of said transformer is formed by winding a winding wire.

16. The power conversion module device of claim 1, wherein at least one of a primary coil and a secondary coil of the transformer is formed of a printed board.

17. The power conversion module device of claim 1, wherein said transformer is mounted on said printed wiring board so that a bottom surface of a magnetic core of said transformer is in contact with said printed wiring board.

18. The power conversion module device of claim 1, wherein said transformer is disposed between said primary power element and said secondary power element.

19. The power conversion module device of claim 3, wherein the resin includes mineral filler.

20. The power conversion module device of claim 6, wherein at least one external connection terminal is operable to form a terminal for connection to the control circuit part.

21. The power conversion module device of claim 13, wherein the thin-plate coil is formed of a copper plate having a thickness of at least 0.3 mm.

22. The power conversion module device of claim 15, wherein the winding wire of the coil has a fusion layer.

23. The power conversion module device of claim 16, wherein a prepreg is inserted between layers of the coil to form a multi-layered printed board coil.

24. The power conversion module device of claim 17, wherein a pattern is formed on a surface of said printed wiring board facing said magnetic core.

25. The power conversion module device of claim 17, wherein a heat conductive member is inserted between said magnetic core and said printed wiring board.

26. The power conversion module device of claim 22, wherein the fusion layer is a type fused by alcohol.

* * * * *